(12) United States Patent
Schmidt et al.

(10) Patent No.: US 10,892,168 B2
(45) Date of Patent: Jan. 12, 2021

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Gerhard Schmidt, Wernberg (AT); Mario Barusic, Seebogen (AT); Benedikt Stoib, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 16/222,592

(22) Filed: Dec. 17, 2018

(65) Prior Publication Data
US 2019/0189463 A1    Jun. 20, 2019

(30) Foreign Application Priority Data
Dec. 18, 2017 (DE) ........................ 10 2017 130 355

(51) Int. Cl.
| | | |
|---|---|---|
| *H01L 21/322* | (2006.01) | |
| *H01L 27/06* | (2006.01) | |
| *H01L 29/32* | (2006.01) | |
| *H01L 29/739* | (2006.01) | |
| *H01L 29/66* | (2006.01) | |

(Continued)

(52) U.S. Cl.
CPC ........ *H01L 21/3223* (2013.01); *H01L 21/265* (2013.01); *H01L 27/0629* (2013.01); *H01L 27/0664* (2013.01); *H01L 28/10* (2013.01); *H01L 29/167* (2013.01); *H01L 29/207* (2013.01); *H01L 29/32* (2013.01); *H01L 29/36* (2013.01); *H01L 29/66136* (2013.01); *H01L 29/66333* (2013.01); *H01L 29/7395* (2013.01);

(Continued)

(58) Field of Classification Search
CPC ............... H01L 21/3223; H01L 21/265; H01L 27/0629; H01L 29/167; H01L 29/207; H01L 29/32; H01L 29/36; H01L 27/0664
USPC ........................................................ 257/140
See application file for complete search history.

(56) References Cited

U.S. PATENT DOCUMENTS 4,053,925 A * 10/1977 Burr .................. H01L 21/26506
                                                        257/376
5,900,652 A *  5/1999 Battaglia ............... H01L 21/221
                                                        257/135

(Continued)

FOREIGN PATENT DOCUMENTS

| | | |
|---|---|---|
| DE | 102007019551 A1 | 10/2008 |
| DE | 102014210406 A1 | 12/2014 |

OTHER PUBLICATIONS

Lutz, Josef, et al., "Semiconductor Power Devices: Physics, Characteristics, Reliability", Springer-Verlag, 2011, pp. 160-167.

*Primary Examiner* — Igwe U Anya
(74) *Attorney, Agent, or Firm* — Murphy, Bilak & Homilier, PLLC

(57) ABSTRACT

A method for forming a semiconductor device includes incorporating recombination center atoms into a semiconductor substrate. The method further includes, after incorporating the recombination center atoms into the semiconductor substrate, implanting noble gas atoms into a doping region of a diode structure and/or a transistor structure, the doping region being arranged at a surface of the semiconductor substrate.

21 Claims, 8 Drawing Sheets

(51) Int. Cl.
*H01L 29/861* (2006.01)
*H01L 29/167* (2006.01)
*H01L 29/207* (2006.01)
*H01L 29/36* (2006.01)
*H01L 21/265* (2006.01)
*H01L 49/02* (2006.01)

(52) U.S. Cl.
CPC ........ *H01L 29/861* (2013.01); *H01L 29/8611* (2013.01)

(56) References Cited

U.S. PATENT DOCUMENTS

| | | | |
|---|---|---|---|
| 6,274,892 B1* | 8/2001 | Kub | H01L 21/187 257/131 |
| 9,337,282 B2* | 5/2016 | Kitamura | H01L 21/22 |
| 2012/0032305 A1* | 2/2012 | Kitamura | H01L 29/36 257/607 |
| 2013/0140667 A1* | 6/2013 | Kalnitsky | H01L 21/823481 257/499 |
| 2014/0070369 A1* | 3/2014 | Kitamura | H01L 29/66136 257/607 |
| 2014/0374882 A1* | 12/2014 | Siemieniec | H01L 29/8611 257/618 |

* cited by examiner

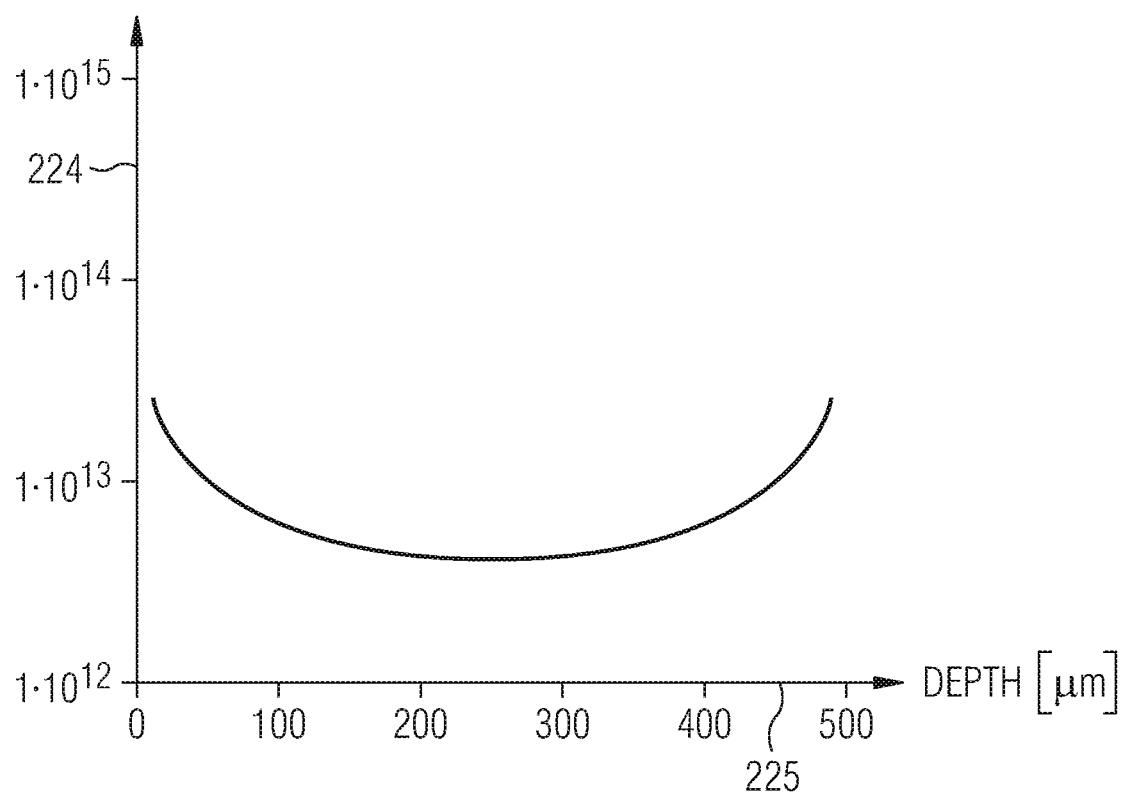

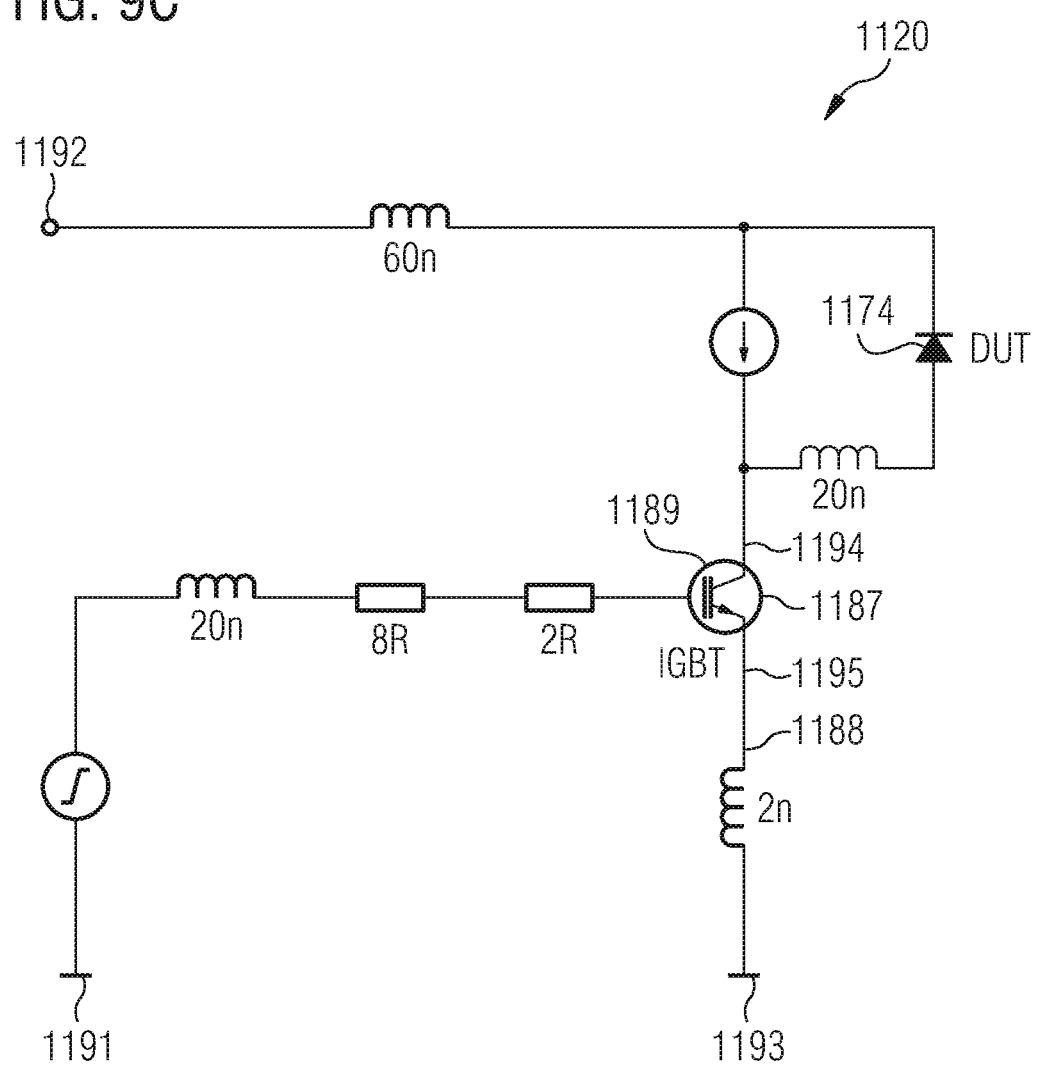

SEMICONDUCTOR DEVICE AND METHOD FOR FORMING A SEMICONDUCTOR DEVICE

TECHNICAL FIELD

Examples relate to concepts for semiconductor structures, and in particular to a semiconductor device, and a method for forming a semiconductor device.

BACKGROUND

In some semiconductor devices, a power transistor may be connected to an inductive load. In the case of a sudden shutdown, and/or the switching on or off of the power transistor, a high induced voltage may be produced due to the inductive load. A free-wheeling diode may be implemented in some semiconductor devices to conduct a current flow driven by the inductance when the transistor is switched off, for example. When the transistor is switched on again, the current possibly still flowing through the diode may be commutated to the power transistor. Some semiconductor devices may nevertheless suffer from high switching losses and/or unstable forward voltages.

SUMMARY

Some embodiments relate to a method for forming a semiconductor device. The method comprises incorporating recombination center atoms into a semiconductor substrate. The method further comprises implanting noble gas atoms into a doping region of at least one of a diode structure and a transistor structure after incorporating the recombination center atoms. The doping region is arranged at a surface of the semiconductor substrate.

Some embodiments relate to a semiconductor device. The semiconductor device comprises a doping region of at least one of a diode structure and a transistor structure. The doping region is arranged at a surface of a semiconductor substrate. A maximal doping concentration of the doping region is at least $1*10^{18}$ dopants per $cm^3$. A maximal doping concentration of recombination center atoms in the semiconductor substrate is at least $1*10^{16}$ recombination center atoms per $cm^3$.

BRIEF DESCRIPTION OF THE FIGURES

Some examples of apparatuses and/or methods will be described in the following by way of example only, and with reference to the accompanying figures, in which

FIG. 2 shows an illustration of a Pt concentration (per $cm^3$) versus depth (μm) profile;

FIG. 9C shows a schematic illustration of a circuit representation of a semiconductor device.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
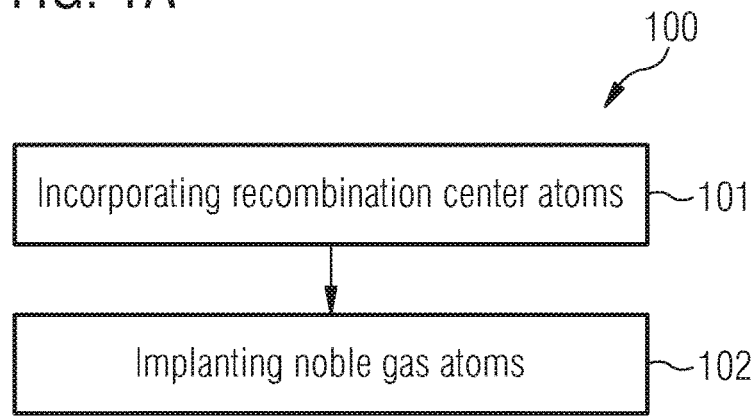
FIG. 1A shows a flow chart of a method for forming a semiconductor device.

FIG. 1A shows a flow chart of a method 100 for forming a semiconductor device according to an example.

The method 100 comprises incorporating (in 101) recombination center atoms into a semiconductor substrate. The method 100 further comprises implanting (in 102) noble gas atoms into a doping region of at least one of a diode structure and a transistor structure after incorporating (in 101) the recombination center atoms. The doping region is arranged at a surface of the semiconductor substrate.

Due to the implanting 102 of the noble gas atoms into the doping region after incorporating 101 the recombination center atoms, any damage caused by implanting 102 the noble gas atoms may be decoupled from the incorporation of recombination center atoms. For example, gettering of the recombination center atoms into unwanted complexes, electrically active clusters and/or electrically inactive clusters, which may be enhanced due to defects in the crystal lattice of the doping region caused by damage implantation 102 may be avoided and/or reduced, since the implanting 102 of the noble gas atoms is carried out after incorporating 101 the recombination center atoms.

Incorporating the recombination center atoms (in 101) may include implanting (e.g. by ion implantation) the recombination center atoms into the semiconductor substrate. The recombination center atoms may be implanted into the semiconductor substrate from a back surface of the semiconductor substrate after the doping region is formed within the semiconductor substrate. Optionally, the recombination center atoms may include at least one type of atoms from the following group of atoms, the group of atoms consisting of: platinum atoms, gold atoms and palladium atoms.

The recombination center atoms may be implanted at an implantation dose of less than $5*10^{13}$ atoms per cm$^2$.

Incorporating the recombination center atoms (in 101) may further include annealing (e.g. heating) the semiconductor substrate after implanting the recombination center atoms, to cause the implanted recombination center atoms to diffuse in the semiconductor substrate. The annealing of the semiconductor substrate may be carried out so that an annealing temperature lies between 750° C. and 950° C. The time period at maximum temperature, apart from the ramping phases, may lie between 5 minutes and several hours, e.g. 2 hours.

The method 100 may further include forming the doping region before incorporating the recombination center atoms. The doping region to be formed may include (or may be) an anode doping region (or a first anode or cathode doping region) of a diode structure, and the doping region may be formed at a surface (e.g. the front surface) of the semiconductor substrate. The doping region may be formed by incorporating dopants of a first type (e.g. p-type dopants) into the semiconductor substrate to form a highly doped portion of the doping region having a first conductivity type (e.g. p+ portion) and a very highly doped portion of the doping region having the first conductivity type (p++ portion).

Incorporating the dopants of the first type may include implanting (e.g. by ion implantation) the dopants of the first type into the semiconductor substrate from the front surface of the semiconductor substrate to form the highly doped portion (p+ portion) of the doping region. The highly doped portion of the doping region may be a p-well doping region, for example. The dopants of the first type may be incorporated into the semiconductor substrate with an implantation dose of between $1*10^{12}$ doping atoms per cm$^2$ and $1*10^{14}$ doping atoms per cm$^2$ (or e.g. between $5*10^{12}$ doping atoms per cm$^2$ and $5*10^{13}$ doping atoms per cm$^2$) to form the highly doped portion of the doping region, for example. The dopants of the first type may be boron, aluminum, gallium, and/or indium dopants. These dopants of the first type may cause the doping region to have the first conductivity type (e.g. p type conductivity).

Incorporating the dopants of the first type to form the doping region may further include annealing the semiconductor substrate after implanting the dopants of the first type, to cause the implanted dopants of the first type to diffuse in the semiconductor substrate to form the highly doped portion (p-well portion) of the doping region. The annealing of the semiconductor substrate may be carried out so that an annealing temperature lies between 800° C. and 1200° C. The thermal budget for forming the highly doped portion of the doping region may be 200 min at 1150° C. to achieve a junction depth of 4 µm. This is equivalent to about 80 min at 1200° C.: i.e. the annealing time amounts to more than 1 hour.

The dopants of the first type may be incorporated into the semiconductor substrate such that an average doping concentration of the highly doped portion of the doping region after annealing the semiconductor substrate is at least $1*10^{14}$ dopants per cm$^3$ (or e.g. between $1*10^{14}$ dopants per cm$^3$ and $1*10^{17}$ dopants per cm$^3$). The average doping concentration may be a measured number of dopants per volume averaged over the highly doped portion of the doping region, for example or may be determined by the integral dose value and the penetration depth of the respective diffusion profile (e.g. for the profiles of FIG. 3 this results in 7.5E15 cm^-3 in the case of p+ and more than 1E19 cm^-3 in the case of p++). The penetration depth for the highly doped region may be considered as the point where the doping concentration of the highly doped portion equals the doping concentration of the underlying substrate.

Forming the doping region may further include incorporating dopants of the first type to form the very highly doped portion (e.g. p++ portion) of the doping region at the surface of the semiconductor substrate after forming the highly doped portion (p+ portion) of the doping region. The dopants of the first type may be incorporated into the semiconductor substrate with an implantation dose of between $1*10^{12}$ doping atoms per cm$^2$ and $1*10^{16}$ doping atoms per cm$^2$ to form the very highly doped portion of the doping region, for example.

The dopants of the first type may be incorporated into the semiconductor substrate such that an average doping concentration of the very highly doped portion (p++ portion) of the doping region after annealing at least part of the semiconductor substrate is between $1*10^{17}$ dopants per cm$^3$ and $1*10^{20}$ dopants per cm$^3$ (e.g. at least $1*10^{18}$ dopants per cm$^3$, at least $5*10^{18}$ dopants per cm$^3$ or at least $1*10^{19}$ dopants per cm$^3$). The average doping concentration may be a measured number of dopants per volume averaged over the very highly doped portion of the doping region, for example, i.e. determined by the integral dose value and the penetration depth of the respective diffusion profile. The penetration depth for the very highly doped region may be considered as the point where the doping concentration of the highly doped portion equals the doping concentration of the highly doped portion of the doping region. Additionally, optionally or alternatively, a maximal doping concentration of the very highly doped portion of the doping region may be at least $1*10^{18}$ dopants per cm$^3$. The dopants of the first type may be implanted at an implantation energy of between 20 keV and 50 keV, for example. Incorporating the dopants of the first type to form the very highly doped portion of the doping region may further include annealing the semiconductor substrate after implanting the dopants of the first type, to cause the implanted dopants of the first type to diffuse in the semiconductor substrate to form the very highly doped portion of the doping region. The annealing of the semiconductor substrate may be carried out so that an maximum annealing temperature lies between 800° C. and 1200° C. The annealing time may be very short in the nanosecond range, if a laser thermal annealing (LTA) process is used with annealing temperatures above T>1414° C. (melting point of silicon). Alternatively a furnace process with annealing times of several hours (e.g. 2 h between 750° C. and 900° C.) may be used. This annealing process can be combined with the Pt diffusion (annealing) process, for example.

After the annealing the semiconductor substrate, the very highly doped portion (p++ portion) of the doping region may be formed between the front surface of the semiconductor substrate and the highly doped portion of the doping region. Additionally, the very highly doped portion (p++ portion) of the doping region may be formed adjacent (e.g. directly adjacent) or overlapping with the highly doped portion (p+ portion) of the doping region.

Even before forming the doping region in the semiconductor substrate, the semiconductor substrate may be lightly doped with a second conductivity type (e.g. n− doping region). The lightly doped region having the second conductivity type may be part of the bulk substrate of the semiconductor substrate. Thus, the lightly doped region having the second conductivity type may have the same doping as the bulk semiconductor substrate. For example, the semiconductor substrate before forming any doping regions may be an n− doped semiconductor substrate. An average doping concentration of the lightly doped region may be between $1*10^{11}$ dopants per $cm^3$ and $5*10^{14}$ dopants per $cm^3$. The average doping concentration may be a measured number of dopants per volume averaged over the lightly doped region, for example.

After the doping region is formed in the semiconductor substrate, the doping region may be formed adjacent to the lightly doped region have a second conductivity type (e.g. n− doping region). After forming the doping region, a p-n junction of a diode structure or a transistor structure may be formed between the anode doping region having the first conductivity type and the lightly doped region having the second conductivity type.

After forming the doping region, the recombination center atoms may be incorporated (in 101) into the semiconductor substrate. After incorporating the recombination center atoms, the noble gas atoms may be implanted (in 102) into the semiconductor at (or from) a front surface of the semiconductor substrate. For example, an Ar implantation performed on the opposite surface to Pt implantation may be used for forming emitter-controlled (EC) diodes (described further in connection with FIG. 3). In emitter-controlled (EC) diodes, a weak anode emitter may lower the switching losses, and on the other hand such an emitter may use an additional boron implantation having a high dose and a low penetration depth for ohmic contacting. However, with increasing dosage, the latter may lead to an increase in the emitter efficiency. Thus, it may be desired to weaken such emitter efficiency using a damage implantation (e.g. by an Ar ion bombardment), to avoid a deterioration of the contact behavior. The implantation of the noble gas atoms may be used to create damages to the crystal lattice of the very highly doped portion of the doping region. Such a damage implantation may weaken the emitter efficiency, which may lead to lower switching losses, for example.

The noble gas atoms may include at least one type of atoms from the following group of atoms, the group of atoms consisting of: argon atoms, helium atoms, neon atoms, krypton atoms and xenon atoms. The noble gas atoms may be implanted (e.g. by ion implantation) at a dose of less than $5*10^{13}$ atoms per $cm^2$. The noble gas atoms may be implanted at an implantation energy of less than 500 keV.

The implantation of the noble gas atoms may be controlled (e.g. by controlling the implantations dose and/or implantations energy) so that after the implantation of the noble gas atoms, more than 50% (or e.g. more than 60%, or e.g. more than 70%, or e.g. more than 90%) of the implanted noble gas atoms are arranged at (or within) a penetration depth equal to or less than a thickness of the very highly doped portion of the doping region after the annealing. For example, a maximal (or largest) penetration depth of more than 50% (or e.g. more than 60%, or e.g. more than 70%, or e.g. more than 90%) of the implanted noble gas atoms may be equal to or less than a maximal (or largest) thickness of the very highly doped portion of the doping region. The maximum penetration depth may be a largest distance range travelled (or reached) by the implanted noble gas atoms from an entry (or implantation) surface (e.g. the front surface) of the semiconductor substrate. The distance may be measured in a substantially perpendicular or orthogonal direction to the lateral entry surface of the semiconductor substrate. The thickness of the very highly doped portion of the doping region may be a distance measured orthogonally from the front surface of the semiconductor substrate, for example.

The method 100 may further include thinning (e.g. grinding) the semiconductor substrate from a back surface of the semiconductor substrate after implanting the noble gas atoms. After thinning the semiconductor substrate, a thickness of the semiconductor substrate (measured in an orthogonal or perpendicular direction between the front surface and the back surface) may be between 30μ and 700 μm). The thinning of the semiconductor substrate may help remove excess platinum clusters in end-of-range (EOR) depth at the implanted surface (e.g. the back surface) of the semiconductor substrate.

The method 100 may further include incorporating dopants of the second type (e.g. hydrogen H atoms) to form a field stop region (e.g. an n+ doping region) of the diode structure (or the transistor structure). The field stop region may be formed between the lightly doped region having the second conductivity type and the back surface of the semiconductor substrate. Incorporating the dopants of the second type to form the field stop region may include implanting the dopants of the second type into the semiconductor substrate from the back surface of the semiconductor substrate. Incorporating the dopants of the second type to form the field stop region may include annealing at least part of the semiconductor substrate. The annealing of the semiconductor substrate may be carried out so that an annealing temperature lies below 700° C. The dopants of the second type may be incorporated so that an average doping concentration of the field stop region after the annealing may lie between $5*10^{14}$ dopants per $cm^3$ and $1*10^{17}$ dopants per $cm^3$ (or e.g. between $1*10^{15}$ dopants per $cm^3$ and $5*10^{16}$ dopants per $cm^3$). The integral dose value over the fieldstop region may lie between $5E11$ cm^-2 and $1e12$ cm^-2.

The method 100 may further include forming a very highly doped region having the second conductivity type (e.g. n++ doping region) at the back side of the semiconductor wafer after forming the field stop region having the second conductivity type. Forming the very highly doped region having the second conductivity type may include incorporating dopants of the second type into the semiconductor substrate after forming the field stop region. The dopants of the second conductivity type may be incorporated into the semiconductor substrate such that an integral does value of the very highly doped region having the second conductivity type is at least $5*10^{14}$ or $5*10^{15}$ dopants per cm$^2$.

The lightly doped region having the second conductivity type (n− doping region), the field stop region having the second conductivity type (n+ doping region) and the very highly doped region having the second conductivity type (n++ doping region) may be part of a cathode doping region (or a second anode or cathode doping region) of the diode structure.

The method 100 may further include forming a back side contact metallization layer (electrode) at the back side (e.g. on the back surface) of the semiconductor substrate after forming the very highly doped region having the second conductivity type. The back side contact metallization layer may be formed directly adjacent to the very highly doped region, for example. The method 100 may further include forming a front side contact metallization layer at the front side (e.g. on the front surface) of the semiconductor substrate directly adjacent to the very highly doped region having the first conductivity type, for example.

In the examples described herein, a doping region comprising the first conductivity type may be a p doped region (e.g. caused by incorporated dopants being boron, aluminum, gallium, and/or indium dopants). Consequently, the second conductivity type indicates an opposite n doped region. Alternatively, it may be that a doping region comprising the first conductivity type may be an n doped region (e.g. caused by incorporated dopants being phosphor ions, antimony, selenium, arsenic, and/or sulfur, tellurium dopants) and consequently, the second conductivity type indicates an opposite p doped region. In other words, the first conductivity type may indicate a p doping and the second conductivity type may indicate an n doping or vice-versa.

A lateral surface or a lateral dimension (e.g. a diameter or a length) of a main surface (e.g. a front surface or a back surface) of the semiconductor wafer may be more than 100 times larger (or more than 1000 times or more than 10000 times) than a distance between a front lateral surface of the semiconductor wafer and a back surface of semiconductor wafer, for example.

The front side surface of the semiconductor wafer may be a semiconductor surface of the semiconductor wafer towards metal layers, insulation layers or passivation layers on top of the semiconductor surface. In comparison to a basically vertical edge (e.g. resulting from separating the chips from each other by dicing the semiconductor wafer) of the semiconductor wafer, the surface of the semiconductor wafer may be a basically horizontal surface extending laterally. The surface of the semiconductor wafer may be a basically even plane (e.g. neglecting unevenness of the semiconductor structure due to the manufacturing process or trenches). For example, the front side surface of the semiconductor wafer may be the interface between the semiconductor material and an insulation layer, metal layer or passivation layer on top of the semiconductor wafer. For example, more complex structures may be located at the front side surface of the semiconductor wafer than at the back side of the semiconductor wafer. A back side surface of the semiconductor wafer may be a side or surface of the semiconductor wafer at which a back side metallization contact structure (e.g. an anode or cathode contact structure) covering more than 50% (or e.g. more than 80%) of the back side surface of the semiconductor wafer is to be formed (or is formed).

A vertical direction may be perpendicular or orthogonal to a lateral surface of the semiconductor wafer (or to a lateral surface of the amorphous semiconductor layer), for example. The implantation surface or entry surface may be the surface (of the semiconductor wafer or a layer) at which the implanted doping ions enter the semiconductor wafer or layer. A doping region formed by the implant of doping ions (e.g. at an end of range region of the doping ion implant) may be located at a depth with respect to an implantation surface used for implanting the doping ions into the semiconductor wafer, for example.

The semiconductor substrate may be a silicon-based substrate (e.g. a silicon (Si) substrate or silicon wafer). Alternatively, the semiconductor wafer of the semiconductor device may be a silicon carbide (SiC) wafer, a gallium arsenide (GaAs) wafer or a gallium nitride (GaN) wafer, for example. The semiconductor wafer may be an epitaxial semiconductor wafer, a Czochralski (CZ) semiconductor wafer, a magnetic CZ semiconductor wafer, or a float zone semiconductor wafer, for example.

The examples described in the method 100 may illustrate the decoupling of two competing mechanisms. The first mechanism may be the setting of the emitter efficiency by the Ar damage implantation. The second mechanism may be the increase of the recombination rate by decreasing the recombination lifetime. In the examples, the diffusion of the implanted platinum may be performed before the emitter efficiency is set. For example, the Ar damage implantation may be performed after the Pt process. A lower Pt implantation dose and implantation energy and lower Ar damage dose and implantation energy may even be achieved due to the decoupling of the two competing mechanisms.

In the examples, the diode structure may be configured in the semiconductor device as a free-wheeling diode (e.g. a fly-back diode), which may be connected to a power transistor. The power transistor may further be connected to an inductive load. In the case of a sudden shutdown, or switching on or switching off of the power transistor, a high induced voltage may be produced due to the inductive load. The free-wheeling diode structure may conduct the current flow driven by the inductance when the transistor is switched off. When the transistor is switched on again, the current flow is inverted until the reverse current drops to zero when recombination of the storage charge is completed.

Thus, the method 100 may include forming a power transistor structure and the diode structure. The diode structure may be connected to the power transistor structure so that the diode structure may be configured to conduct a current from the power transistor if the power transistor is switched from a conducting state to a non-conducting state.

The semiconductor device to be formed by the method of 100 may be able to control the inductive load connected to the power transistor. Examples of such inductive loads may be electric motors in voltage source converters for variable-speed drives, which may be used in consumer applications such as washing machine, and/or air-conditioning systems, and/or in drive technology for railway and industrial applications. The power transistor of the semiconductor device to be formed may include (or may be) a fast switching metal oxide semiconductor (MOS) power transistor, such as insulated gate bipolar transistor (IGBT), which may be used in the higher voltage range. Depending on the area of applications, the semiconductor device to be formed may be dimensioned for a blocking capability ranging from 600V to 6500V. By mutual switching on and/or off in a bridge circuit, the desired frequency may be generated at the output (e.g. by pulse width modulation).

The method 100 may provide concepts for forming a semiconductor device with low switching losses and high switching speed. In order to keep the switching losses as low as possible, a high switching speed may be desired. However, due to the inductive load, a high induced voltage may be produced in case of a sudden shutdown destroying the active switch. The free-wheeling diode (e.g. such as the diode structure formed by method 100) may be provided in a parallel branch that may continue to lead the current flow driven by the inductance. When the transistor is switched on again, the current still flowing through the diode may be commutated to the IGBT. Here, the switch-on speed of the transistor may determine the steepness of the decrease in current in the diode, the so-called dI/dt (I=current, t=time). In addition to the switching speed and the bias current, stored charge may also be a factor. Its amount may be determined by the speed of the recombination of electrons and holes (which carry the current in a forward direction) during the depletion process in the diode. The corresponding characteristic time constant is the so-called minority charge carrier lifetime, $\tau$.

The switching losses may be reduced by lowering the minority charge carrier lifetime, $\tau$. Diffusion of the heavy metal recombination center atoms (e.g., gold (Au) or platinum (Pt)) (in 101) into the drift zone of the semiconductor device may be carried out to reduce $\tau$. The heavy metal atoms substitutionally incorporated on a lattice space may occupy vacancies in the host lattice forming centers in the forbidden band with a mid-band range energy level, and may result in a corresponding increase in recombination rate due to the associated higher trapping rate for electrons and holes. However, during blocking operation of the diode, the recombination centers may act the other way round as generation centers and may result in an increase in leakage current. Compared to the gold (Au) centers, the platinum (Pt) centers may have an energy level that is slightly more decentralized in relation to the band center. Thus, the Pt centers may have a lower generation rate, as the generation rate decreases exponentially with the distance to the band center. Therefore, Pt may be used in the power semiconductor device, and may lead to lower leakage current values (compared to Au). This may be so in the case of higher operating temperatures, which may range from 125° C. to 175° C. depending on the application and voltage class of the semiconductor device.

The method 100 may further provide concepts for controlling the minority carrier lifetime, $\tau$, of the diode structure. The method 100 includes an implantation process for implanting recombination center atoms (in 101). Instead of implanting the recombination center atoms, the lifetime setting of IGBT free-wheeling diodes, and controllably setting the anode emitter efficiency (e.g. in EC diodes), may alternatively be performed by a diffusion of Pt from a platinum silicide PtSi layer. For example, a thin Pt layer (e.g. approximately 10 nm to 20 nm) may be deposited by evaporation or sputtering onto the semiconductor body. Then, an intermetallic phase of platinum silicide (PtSi) may then be formed by an alloying process. In the PtSi process, after any excess metallic platinum has been removed in an aqua regia etching, the Pt from the silicide may be diffused into the semiconductor crystal using a further oven process at a temperature between 750° C. and 900° C. to set the forward voltage ($V_F$ setting). The silicide may be formed via a contact hole, for which an intermediate oxide (IOX) may be used for masking the chip edge. The platinum may be used to set the lifetime, $\tau$, and the silicide may be considered to be a practically inexhaustible source. The temperature may determine the solid solubility and thus the surface concentration. In addition, the amount of platinum incorporated on the substitutional lattice sites in the drift path of the device which form the desired recombination centers, may also depend on the thermal budget (temperature×time) of the Pt diffusion. The concentration of the centers in the middle of the drift zone may follow a law that describes its growth proportional to the square root of time, for example.

In serial production, the $V_F$ value may be used to monitor the effectiveness of lifetime killing (e.g. $\tau$ reduction). The increase in recombination rate may lead to an increase in the stationary drop in forward voltage $V_F$ of the diode, which may lead to an increase in forward losses. However, this may play only a minor role as the switching frequency increases.

Another parameter that may be considered during wafer testing is the leakage current ($I_R$) during the blocking state of the device. Pt doping may generally supply a low value of leakage current. However, crystal defects may form during the production, which may affect the electrical parameters. Such crystal defects may include, slip lines, dislocation loops or other extended defects, which may lead to increased variations in $V_F$ and $I_R$. Some other variables (segregation or gettering effects caused by a thermal oxide at the semiconductor surface or a highly doped edge zone) may also affect the desired Pt distribution, for example.

Compared to the diffusion of Pt from a PtSi layer, the implantation process used to incorporate the platinum may offer better reproducibility in terms of the dose due to its good controllability. Also, the manufacturing process may be less expensive. However, the limited Pt dose may face a number of competing processes during the diffusion. For example, in a worst case, a majority of the incorporated platinum may be bound in unwanted complexes, electrically active and/or inactive clusters, which may lead to an insufficient amount of platinum being available for the substitutional lattice incorporation. During the Pt implantation, a scattering oxide for the implantation may therefore be removed prior to the Pt diffusion. Additionally, the highly doped $n^+$-emitter (at the back surface) may be manufactured after the high temperature process (for the Pt diffusion). Otherwise, the presence of the high phosphorus (P) concentration (from the n+ emitter) during the Pt diffusion may getter a part of the platinum, which may lead to strong variations in the $V_F$ setting. The $n^+$-emitter may be formed (or manufactured) by a phosphorus P implantation after the Pt diffusion and the activation may be carried out by a laser process, during which short laser pulses may prevent the interaction between the platinum and the phosphorus, which may lead to "phosphorus diffusion gettering" of the platinum, for example. Since no PtSi layer is deposited, no disturbing Pt silicide is present in the contact hole, for example.

Figure 1B:
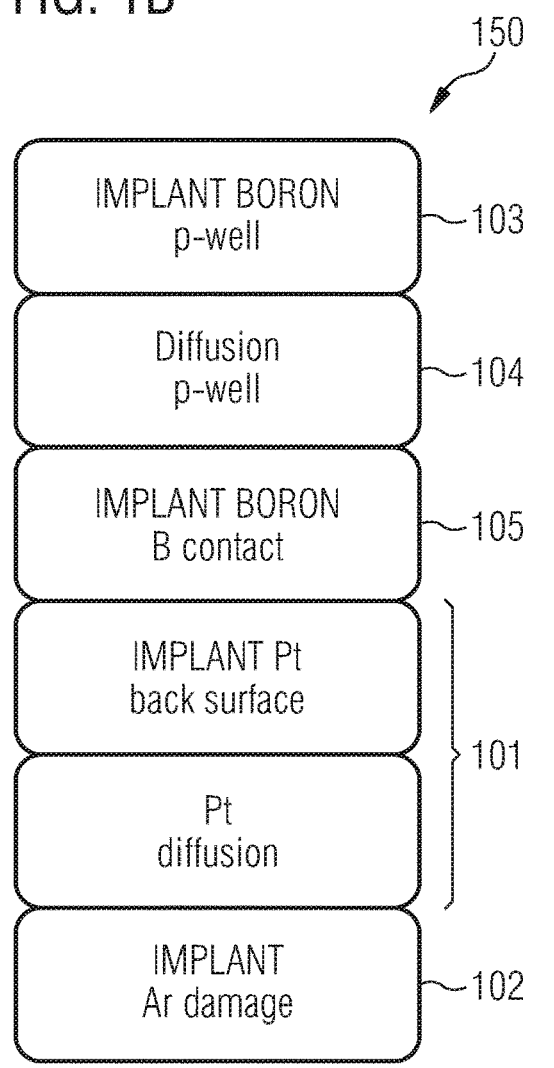
FIG. 1B shows a flow chart of a further method for forming a semiconductor device.

FIG. 1B shows a flow chart of a method 150 for forming a semiconductor device. The method 150 may be similar to the method 100. For example, the method 150 may include one or more or all of the features described with respect to method 100. The method 150 may be a manufacturing process for forming an IGBT freewheeling diode structure, for example.

The method 150 may include forming a doping region in the semiconductor substrate. The doping region to be formed may be an anode doping region of a diode structure. Forming the doping region may include implanting (in 103) (e.g. by ion implantation II) the dopants of the first type (e.g. boron B) atoms into the semiconductor substrate to form a p-well doping region (which may become a highly doped portion (p+ portion) of the doping region to be formed). Forming the doping region in the semiconductor substrate may further include annealing the semiconductor substrate (in 104) after implanting the dopants of the first type to cause a diffusion (e.g. a diffusions process) of the implanted dopants of the first type in the semiconductor substrate to form the p-well doping region. The annealing of the semiconductor substrate may be carried out so that a maximum annealing temperature of more than 900° C. The thermal budget for forming the highly doped portion of the doping region may be 200 min at 1150° C. to achieve a junction depth of 4 µm. This is equivalent to about 80 min at 1200° C.: i.e. the annealing time amounts to more than 1 hour.

The dopants of the first type may be incorporated into the semiconductor substrate such that an average doping concentration of the highly doped portion of the doping region after annealing the semiconductor substrate is at least $5*10^{14}$ dopants per $cm^3$ (or at least $1*10^{15}$ dopants per $cm^3$ or at least $5*10^{15}$ dopants per $cm^3$). The average doping concentration may be determined according to the ratio between integral dose and depth as mentioned above.

Forming the doping region may further include implanting (e.g. by ion implantation II) dopants (e.g. boron B) of the first type into the semiconductor substrate with an implantation dose of $1*10^{15}$ doping atoms per $cm^2$ and an implantation energy of 30 keV to form the very highly doped portion (a p++ portion) of the doping region, for example. The very highly doped portion of the doping region may be formed after forming the highly doped portion of the doping region, for example. The very highly doped portion may form a good ohmic contact to a front side contact metallization layer to be formed at the front side of the semiconductor wafer.

The method 150 may further include incorporating the recombination center atoms (in 101) into the semiconductor substrate after forming the very highly doped portion of the doping region. Incorporating the recombination center atoms 101 may include implanting (e.g. by ion implantation) the recombination center atoms (e.g. platinum Pt) into the back surface of the semiconductor substrate. The recombination center atoms may be implanted at an implantation dose of $1*10^{13}$ atoms per $cm^2$ Incorporating the recombination center atoms (in 101) may further include annealing (e.g. heating) the semiconductor substrate so that Pt diffusion in the semiconductor substrate occurs. The annealing temperature of the annealing time period may be at least 750° C.

The method 150 may further include implanting the noble gas atoms (in 102) after incorporating the recombination center atoms. The noble gas atoms (e.g. argon Ar atoms) may be implanted (e.g. by ion implantation) at an implantation dose of $2*10^{13}$ atoms per $cm^2$), and at an implantation energy of less than 500 keV (or e.g. 285 keV). The implantation of noble gas atoms may cause damage at the front surface of the semiconductor substrate, for example.

The method 150 may further include incorporating dopants of the second type (e.g. hydrogen H atoms) to form a field stop FS region of the diode structure (or the transistor structure). Incorporating the dopants of the second type to form the field stop region may include implanting the dopants of the second type into the semiconductor substrate from the back surface of the semiconductor substrate. Incorporating the dopants of the second type to form the field stop region may further include annealing (in 107) at least part of the semiconductor substrate after implanting the dopants of the second type. The annealing of the semiconductor substrate may be carried out so that an annealing temperature is 400° C. to 500° C. for about 150 minutes, for example.

More details and aspects are mentioned in connection with the embodiments described above or below. The embodiments shown in FIG. 1B may comprise one or more optional additional features corresponding to one or more aspects mentioned in connection with the proposed concept or one or more embodiments described above (e.g. FIG. 1A) or below (FIGS. 2 to 9C).

FIG. 2 shows an illustration of electrically active Pts concentration which is recombination effective 224 (per $cm^3$) versus depth 225 (µm). For example, FIG. 2 shows a U-shaped distribution of a concentration of the substitutional Pt centers (named Pts) determined using DLTS measurements (Deep Level Transient Spectroscopy).

A strong challenge for the implanted platinum (recombination center atoms) may be caused by the generation of lattice damage in the implanted edge zone. For example, with an increasing implantation dose, a decreasing share or portion of the incorporated Pt amount may become electrically activated. For example, for a 1200V diode, a saturation level may be reached for the $V_F$ value, as soon as the dose reaches a threshold of around $1*10^{13}$ dopants per $cm^2$. An integral dose value of the substitutional incorporated platinum for setting the lifetime may be in the order of $1*10^{12}$ dopants per $cm^2$, or which 90% of the Pt dose may exist as electrically inactive clusters. FIG. 2 illustrates such a distribution after the implantation of a Pt dose of $5*10^{13}$ dopants per $cm^2$ and a diffusion at 800° C. for over 2 hours. The average doping concentration of the electrically active recombination center atoms may be less than $1*10^{15}$ recombination center atoms per $cm^3$. The integral dose of the Pts centers may be about $6*10^{11}$ dopants per $cm^2$ at 800° C., and may increase to about $1*10^{12}$ dopants per $cm^2$ at 850° C., for example. The edge concentration may be between $3*10^{14}$ atoms per $cm^3$ and $4*10^{14}$ atoms per $cm^3$, which may be several orders of magnitude smaller than the edge concentration of the inactive clustered platinum as shown in the SIMS analyses in FIGS. 7 and 8. The solubility of Pt at 800° C. is approximately 1E14 cm^-3 and at 850° C. app. 5E14 cm^-3.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A to 1B) or below (FIGS. 3 to 9C).

The formation of crystal damage by the implantation process leads to the formation of getter centers, effectively reducing the electrically activated Pt concentration.

Figure 3:
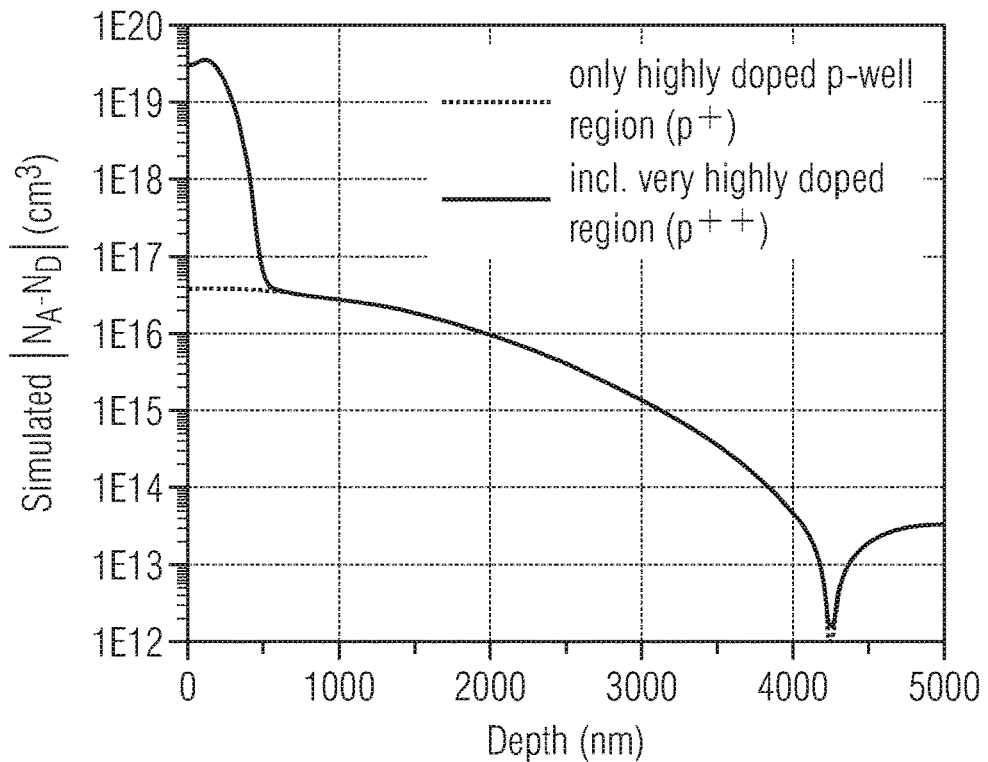
FIG. 3 shows a simulated net doping concentration between a surface and a depth of 5000 nm.
Figure 4:
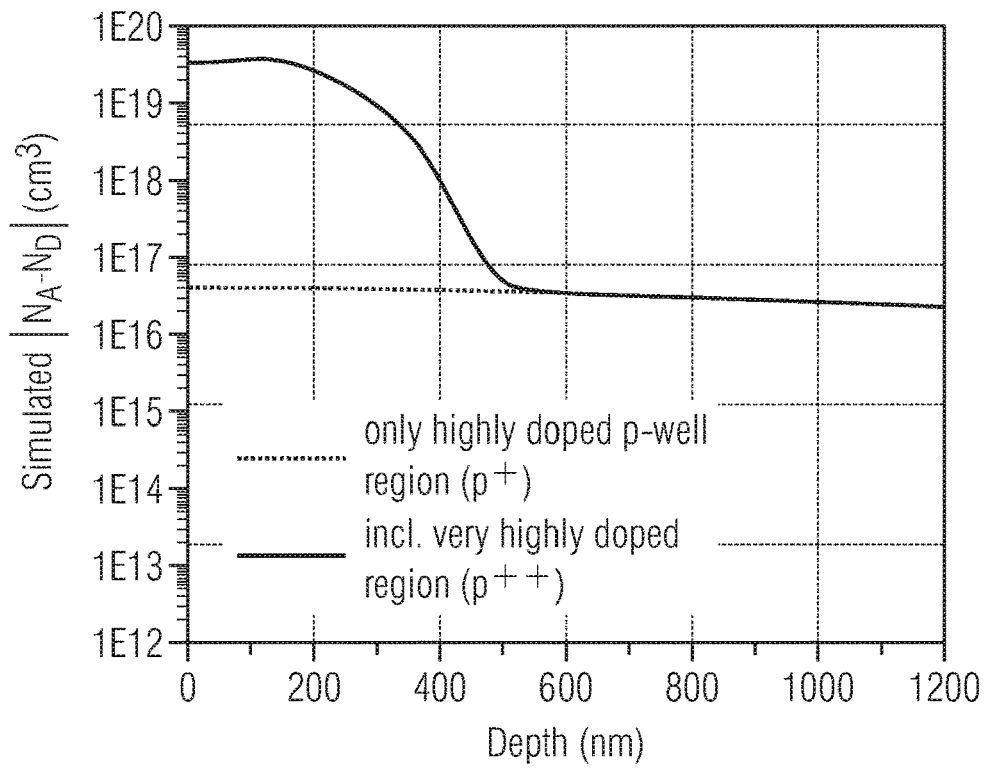
FIG. 4 shows the simulated net doping concentration of FIG. 3 between the surface and a depth of 1200 nm.

FIG. 3 shows a simulated net doping concentration $|N_A-N_D|$ between a surface and a depth of 5000 nm and FIG. 4 shows the simulated net doping concentration of FIG. 3 between the surface and a depth of 1200 nm.

FIG. 3 shows an illustration of an anode profile of a diode structures which may be produced or formed by the method 100 and/or method 150.

An exemplary diode structure (e.g. the diode doping region) may be formed with a high junction depth which may level off the concentration gradient sharply. Then, another boron implantation may be performed to ensure an ohmic contact. Such boron implantation may have a value in the order of magnitude of the anode implantation dose, but a lower implant energy and depth. Electrical activation may take place through a following high temperature process, but with much lower thermal budget than used for the formation of the diode doping region. The process control may lead to a junction depth of around 4 µm and a surface concentration of around $4·10^{16}$ $cm^{-3}$ (shown as dotted line in FIG. 3).

The surface concentration of the contact implantation (e.g. the very highly doped p++ portion of the doping region formed in methods 100, 105) may be larger than that of the highly doped portion of the doping region by at least one order of magnitude to form a low ohmic contact region. This may lead to an increase in the emitter efficiency to an extent that the switching losses of the diode may become unacceptably high. Thus, the Ar damage implantation (in 102 of methods 100, 105) may be performed to reduce the emitter efficiency to an appropriate level again.

More details and aspects are mentioned in connection with the embodiments described above or below. The embodiments shown in FIGS. 3 and 4 may comprise one or more optional additional features corresponding to one or more aspects mentioned in connection with the proposed concept or one or more embodiments described above (e.g. FIGS. 1A to 2) or below (FIGS. 5 to 9C).

Figure 5:
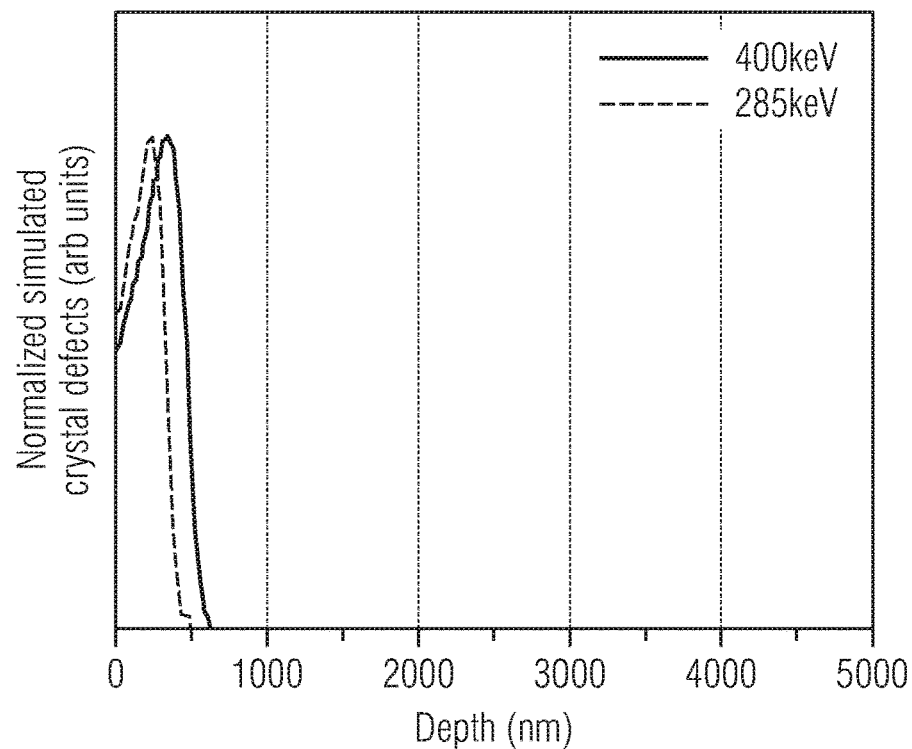
FIG. 5 shows a normalized simulated distribution of crystals defects between a surface and a depth of 5000 nm.
Figure 6:
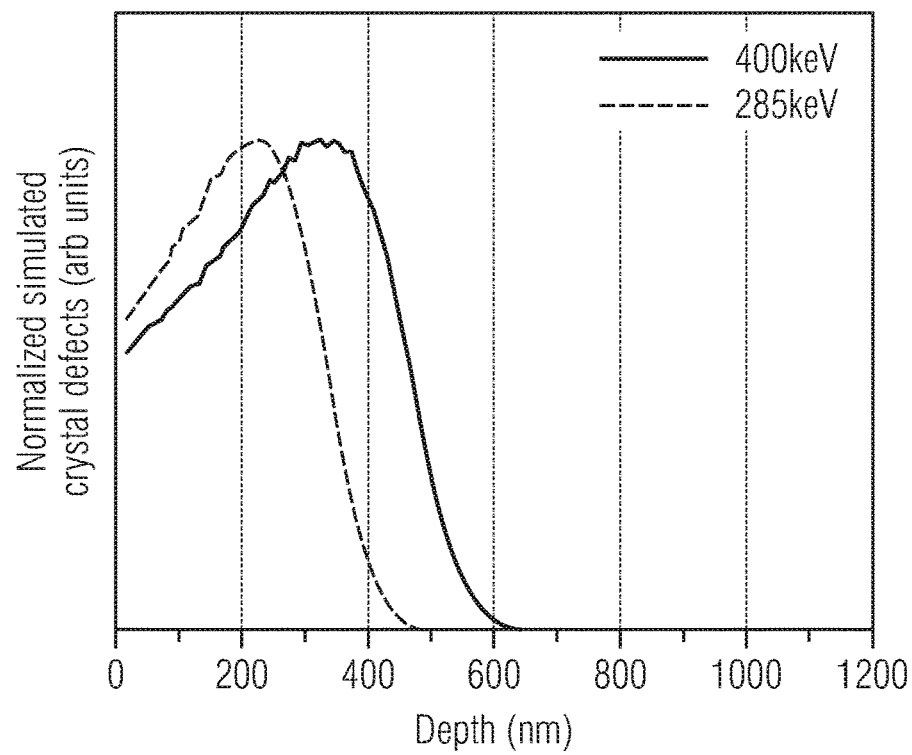
FIG. 6 shows the normalized simulated distribution of crystals defects of FIG. 5 between the surface and a depth of 1200 nm.

FIG. 5 shows a normalized simulated distribution of crystals defects created by the Ar damage implantation between a surface and a depth of 5000 nm and FIG. 6 shows the normalized simulated distribution of crystals defects of FIG. 5 between the surface and a depth of 1200 nm.

A sufficiently high implant energy level may be used in order to obtain a penetration depth that radiates reaches through the highly doped zone of the contact implantation (p++ doped portion). The comparison shows the correlation of the implant energy to the crystal defect distribution over depth. This zone may lead to a large gettering effect of the implanted platinum under these boundary conditions even if the Ar implantation were to be carried out at the side opposite to the Pt implantation. One possible way to obtain the desired $V_F$ setting at a constant Pt diffusion temperature may be a large increase in the implanted Pt dose. For example, by raising the Pt dose to $6*10^{13}$ atoms per cm$^2$, it may actually be possible to bring the $V_F$ to a sufficiently high value, compared to the Pt dose of $1*10^{13}$ atoms per cm$^2$. However, this may also lead to the diffusion temperature being raised by around 5° C., which may lead to a stronger formation of Pt-decorated slip lines that may lead to an increase in the leakage current of the device. Such a dose value may also be a threshold for the beginning of the saturation, as a further increase in dose does not necessarily result in a further increase in the $V_F$ value. Under the stated boundary conditions, the carrier lifetime setting may be controlled by two competing mechanisms of the Pt in-diffusion and the simultaneous gettering in the Ar damage, which may be linked to a certain degree to the crystal defect annealing which increases at higher Pt diffusion temperatures. Therefore, the substitutional Pt used for the $V_F$ setting may be the outcome of the subtraction of two large numbers that may naturally show a significant degree of fluctuation. In addition, such a large Pt implantation dose may also be unattractive to process technology as it may lead to longer exposure times and additionally causes high costs. Thus, the Pt implantation dose may be reduced, to e.g. about $1*10^{13}$ atoms per cm$^2$ for a 1200V device.

More details and aspects are mentioned in connection with the embodiments described above or below. The embodiments shown in FIGS. 5 and 6 may comprise one or more optional additional features corresponding to one or more aspects mentioned in connection with the proposed concept or one or more embodiments described above (e.g. FIGS. 1A to 3) or below (FIGS. 7 to 9C).

As the forward voltage of a diode comprises the series resistances of the bulk and contact resistances, and as the bulk resistance is increased with an increasing number of electrically active recombination centers (e.g. Pts centers), the forward voltage is often chosen in semiconductor fabrication to monitor both the contact resistance and the effective lifetime killing introduced. In case when gettering centers as e.g. introduced by noble gas implantation are present before annealing the recombination center atoms, the latter species is predominantly found in this damage region and the forward voltage measured is low. In this case, VF value is mostly determined by the knee voltage of the pn junction and the series resistance of the remaining substrate which does not comprise a considerable amount of Pts centers. For example for a 1200V Si diode which is effectively free of recombination centers, the forward voltage may e.g. be 1 V, whereas the same device with an appropriate number of recombination centers and an emitter efficiency typical for applications as freewheeling diodes may be e.g. 1.5 V. If now the contact resistance is increased, e.g. by a too severely damaging the emitter to reduce its efficiency, the forward voltage may rise to unreasonable values, e.g. above 2 V and also the I-V characteristic comprises regions of negative differential resistance.

By avoiding the Pt gettering during the diffusion, it may be possible to use a Pt implantation dose of $1*10^{13}$ dopants per cm$^2$ and/or to simultaneously lower the dose for the Ar damage implantation by one order of magnitude to $2*10^{13}$ atoms per cm$^2$.

It may be possible to reduce the Ar energy even further, which may further reduce the leakage current.

SRP (Spreading Resistance Profiling), SIMS (Secondary Ion Mass Spectrometry) analyses, and DLTS measurements may be carried out to measure the distribution of donors, acceptors, total Pt and Pts concentrations respectively in the diode structure. While the solubility limit cannot be exceeded in the diffusion from the silicide as a Pt source, the Pt concentration in the projected range may be increased by several orders of magnitude, compared to the former, during the implantation dependent of the used dose values. With the diffusion from an inexhaustible source (e.g. a PtSi layer), a surface concentration due to the solubility limit may be calculated according to the following relation:

$$C_S = 4.44 \cdot 10^{24} \cdot \exp(-2{,}212 \text{ eV}/kT) \text{cm}^{-3}$$

With regard to an in-diffusion temperature of 857° C. (after Pt implantation), a maximal Pt concentration of about $6*10^{14}$ dopants per cm$^3$ may be obtained, that may strictly monotonically falling towards the middle of the wafer (as shown in FIG. 2). In contrast, with regard to the implantation of a Pt dose of $1*10^{13}$ atoms per cm$^2$ at an energy of 80 keV, a Monte Carlo simulation may lead to a maximum concentration of $4.5*10^{18}$ cm$^{-3}$ which may be 4 orders of magnitude over the solubility limit. The concentration maximum may be at a depth of 39 nm during the implantation.

Figure 7:
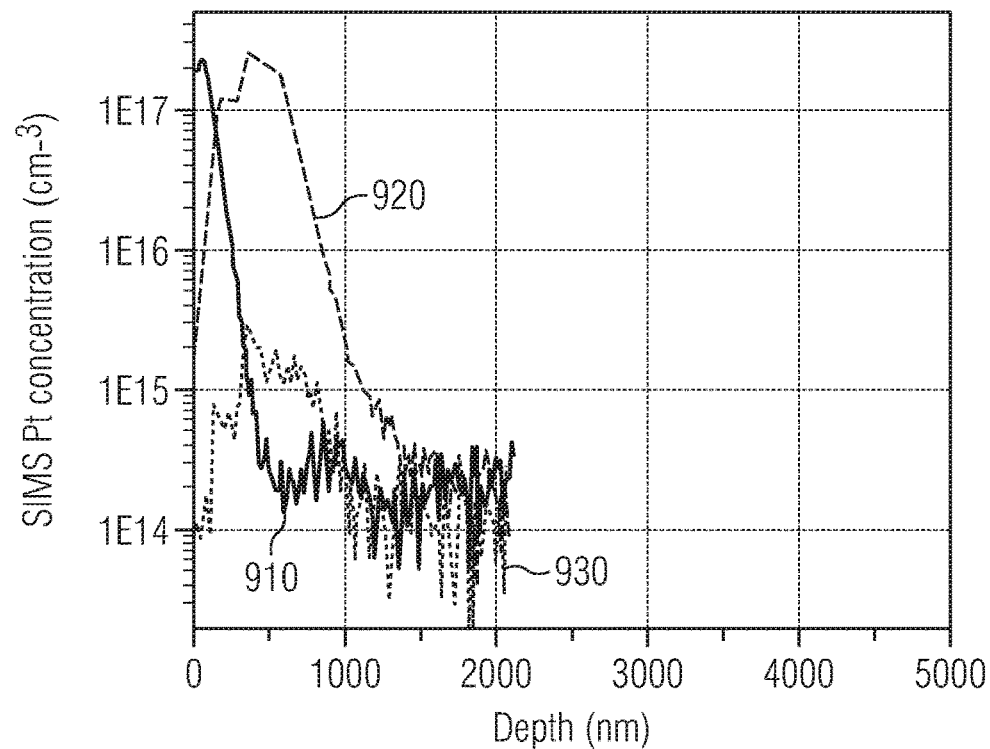
FIG. 7 shows an illustration of a Pt concentration (per $cm^3$) versus depth (μm) profile between a surface and a depth of 5000 nm.
Figure 8:
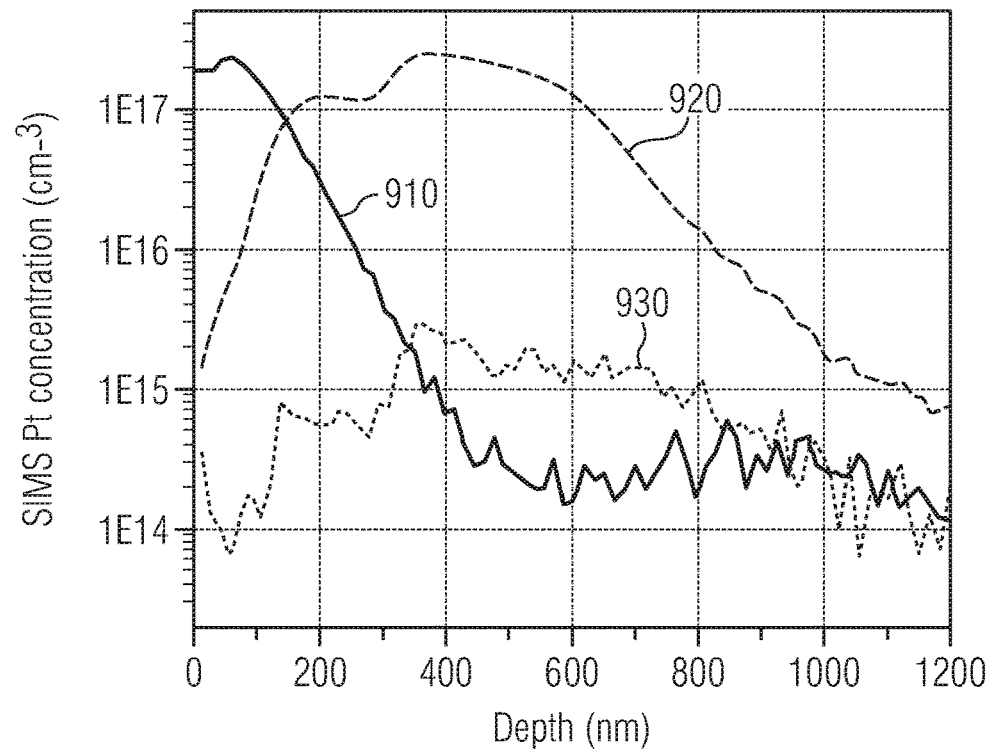
FIG. 8 shows the illustration of a Pt concentration (per $cm^3$) versus depth (μm) profile of FIG. 7 between the surface and a depth of 1200 nm.

FIG. 7 illustrates the Pt distribution (atoms per cm$^3$) versus depth (μm), which may lead to the stated values for the implantation after the diffusion at a temperature of 780° C. For example, no process with a thermal budget above 700° C. may be provided to allow Pt diffusion after Ar ion implantation II (indicated by line 910), in contrast to a process providing thermal budget above 700° C. after Ar ion implantation II leading to gettering of Pt at the crystal defect centers (indicated by line 920) or a process with Ar implantation and PtSi diffusion (indicated by line 930). The profiles of the Pt from the implanted side (e.g. back surface) and from the opposite side (e.g. front surface) were determined using a SIMS analysis and were plotted on top of each other. The SIMS analysis was used to measure the distribution of Pt concentration bound in "clusters". FIG. 8 shows the illustration of a Pt concentration (per cm$^3$) versus depth (μm) profile of FIG. 7 between the surface and a depth of 1200 nm.

More than 10% of the electrically inactive Pt reaches the very highly doped region, around 10% are substitutionally activated and the major part remains in the EOR region at the backside which is removed in a thinning process, for example. The surface concentration of the electrically inactive Pt may correspond to $2*10^{17}$ atoms per $cm^3$ and thus clearly be above the concentration of the substitutionally incorporated platinum and/or above the value which can be reached during the diffusion from the silicide. The Pt concentration may drop to the detection limit of SIMS analysis within a distance of around 100 nm.

The Pt distribution to be expected at the surface may be different for the high Pt dose. For the high Pt dose of around $6*10^{13}$ atoms per $cm^2$, only a small fracture ranging around 1% to 2% may be substitutionally incorporated into lattice spaces in a $V_F$ efficient manner, and it may be possible to adjust $V_F$. The rest may travel into the Ar damage zone during the Pt diffusion and may precipitate out in the form of Pt clusters.

In contrast to the situation, wherein the Pt diffusion and the Ar damage implantation are decoupled, the Pt concentration may achieve high values that may be in the order of magnitude of $1*10^{18}$ atoms per $cm^3$ across the whole damage depth range of 600 nm corresponding to a dose value of approximately 10%.

More details and aspects are mentioned in connection with the embodiments described above or below. The embodiments shown in FIGS. 7 and 8 may comprise one or more optional additional features corresponding to one or more aspects mentioned in connection with the proposed concept or one or more embodiments described above (e.g. FIGS. 1A to 6) or below (FIGS. 9A to 9C).

Figure 9A:
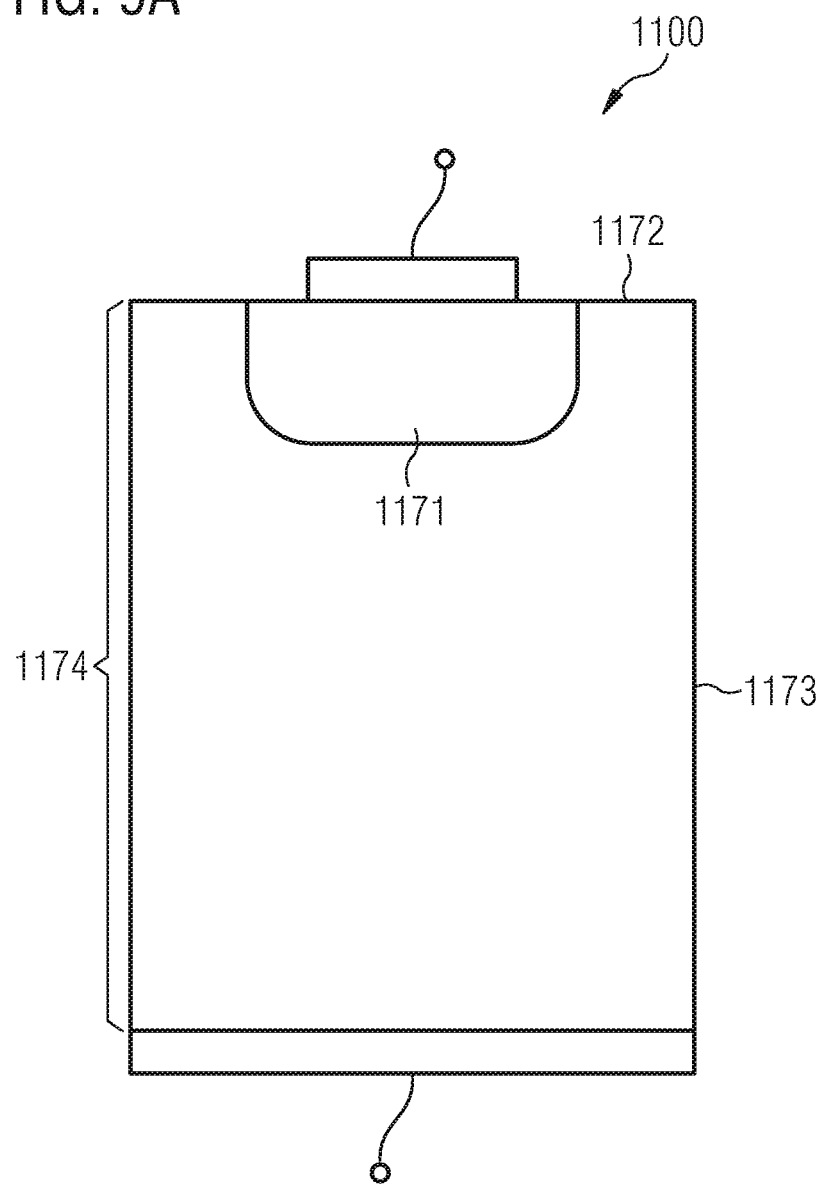
FIG. 9A shows a schematic illustration of a semiconductor device.
Figure 9B:
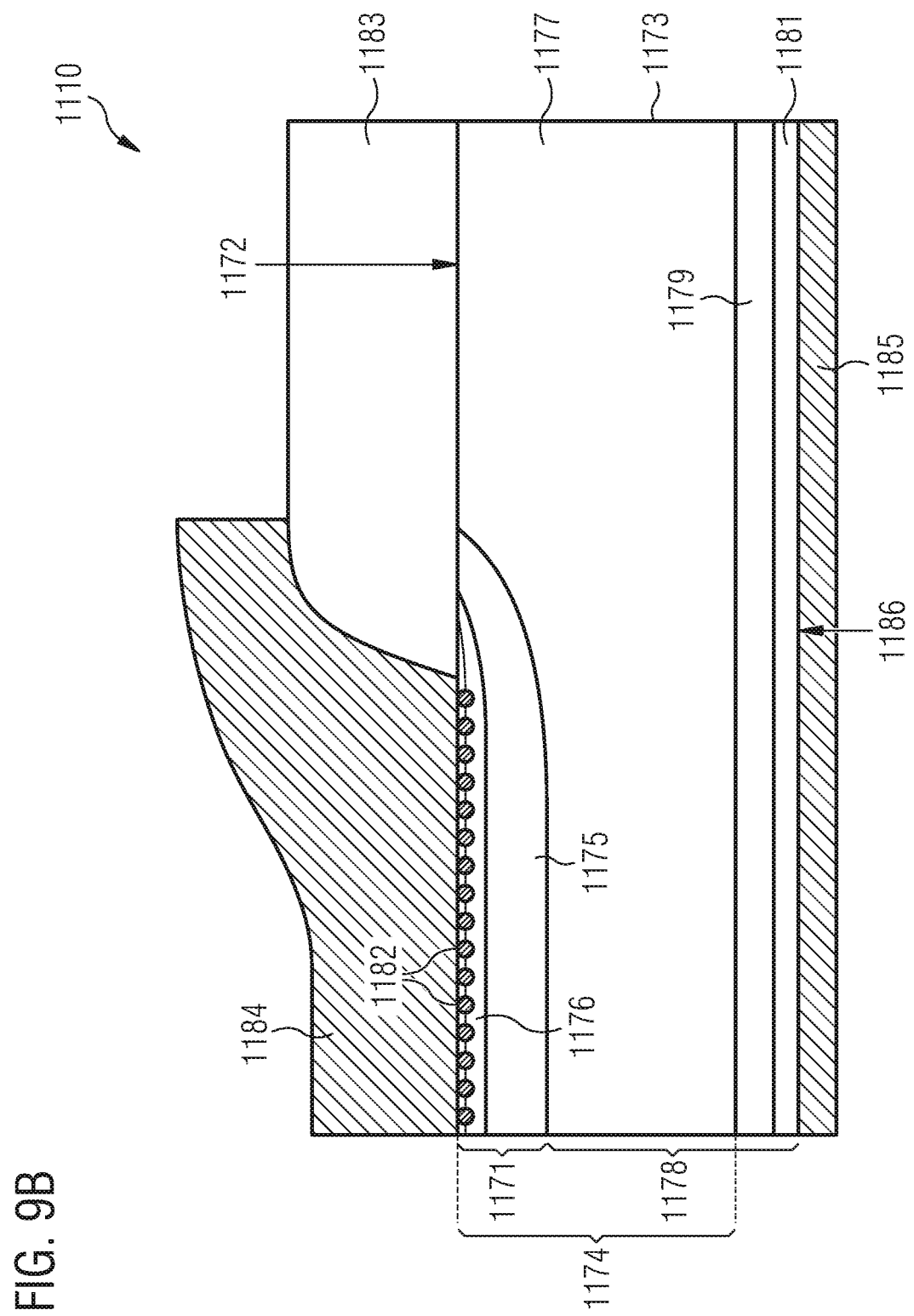
FIG. 9B shows a schematic illustration of a further semiconductor device.

FIG. 9A shows an illustration of a cross-sectional side view of a semiconductor device 1100.

The semiconductor device 1100 comprises a doping region 1171 of at least one of a diode structure and a transistor structure 1174. The doping region 1171 is arranged at a surface 1172 of a semiconductor substrate 1173. A maximal doping concentration of the doping region 1171 is at least $1*10^{18}$ dopants per $cm^3$. A maximal doping concentration of recombination center atoms in the semiconductor substrate 1173 is at least $1*10^{16}$ recombination center atoms per $cm^3$.

Due to the maximal doping concentration of the doping region 1171 being at least $1*10^{18}$ dopants per $cm^3$, an anode with high emitter efficiency may be obtained. However, due to the maximal doping concentration of the recombination center atoms in the semiconductor substrate 173 being at least $1*10^{16}$ recombination center atoms per $cm^3$, a recombination rate of the diode structure may be increased, which may lead to an increase in the forward voltage $V_F$.

The doping region 1171 may include (or may be) an anode (or a first anode or cathode) doping region of a diode structure 1174. The doping region 1171 may be formed at the front surface 1172 of the semiconductor substrate 1173 and the doping region 1171 may have a first conductivity type (e.g. p type doping). The doping region 1171 may include a highly doped portion (p+) and very highly doped portion (p++). The very highly doped portion (p++) of the doping region 1171 may be arranged at the surface 1172 of the semiconductor substrate 1173. The very highly doped portion (p++ portion) of the doping region 1171 may be arranged between the front surface 1172 of the semiconductor substrate 1173 and the highly doped portion of the doping region 1171.

An average doping concentration of the very highly doped portion (p++ portion) of the doping region 1171 may be between $1*10^{17}$ dopants per $cm^3$ and $1*10^{20}$ dopants per An average doping concentration (see above) of the highly doped portion of the doping region 1171 may be at least $1*10^{14}$ dopants per $cm^3$ (or e.g. between $1*10^{14}$ dopants per $cm^3$ and $1*10^{17}$ dopants per $cm^3$, or e.g. between $1*10^{14}$ dopants per $cm^3$ and $1*10^{16}$ dopants per $cm^3$).

The recombination center atoms may include at least one type of atoms from the following group of atoms, the group of atoms consisting of: platinum atoms, gold atoms and palladium atoms.

An average doping concentration of recombination center atoms in the very highly doped portion of the doping region 1171 may be at least $1*10^{17}$ recombination center atoms per $cm^3$ (or e.g. at least $1*10^{18}$ recombination center atoms per $cm^3$, or e.g. between $1*10^{17}$ recombination center atoms per $cm^3$ and $1*10^{19}$ recombination center atoms per $cm^3$, or e.g. between $2*10^{17}$ recombination center atoms per $cm^3$ and $5*10^{18}$ recombination center atoms per $cm^3$). The average doping concentration may be a measured number of recombination center atoms per volume averaged over the thickness of the very highly doped portion of the doping region 1171, for example.

The doping region may be an anode (or cathode) doping region of a diode structure. The diode structure may be configured in the semiconductor device 1100 as a freewheeling diode (e.g. a fly-back diode). For example, the semiconductor device 1100 may further include a power transistor structure (e.g. an IGBT) connected to an inductive load. The diode structure may be connected to (e.g. configured with respect to) the power transistor structure such that the diode structure is configured to conduct a current from the power transistor if the power transistor is switched from a conducting state to a non-conducting state.

The doping region is however, not limited to being an anode (or cathode) doping region of a diode structure. Alternatively or optionally, the doping region may be a collector or emitter doping region of a transistor structure. For example, the doping region may be an anode emitter (or a cathode collector) of an IGBT structure, or a source region (or drain region) of a MOSFET structure (e.g. a coolMOS MOSFET).

The semiconductor device 1100 may be a power semiconductor device having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects are mentioned in connection with the embodiments described above or below. The embodiments shown in FIG. 9A may comprise one or more optional additional features corresponding to one or more aspects mentioned in connection with the proposed concept or one or more embodiments described above (e.g. FIGS. 1A to 8) or below (FIGS. 9B to 9C).

FIG. 9B shows an illustration of a cross-sectional side view of a semiconductor device 1110.

The semiconductor device 1110 may be similar to the semiconductor device 1100 described in connection with FIG. 9A. For example, the semiconductor device 1110 may include one or more or all of the features already described in connection with FIG. 9A.

As shown in FIG. 9B, the semiconductor device 1110 may include the diode structure 1174. The diode structure 1174 may include the doping region 1171 having the first conductivity type. The doping region 1171 may be formed at the front surface 1172 of the semiconductor substrate 1173. The doping region 1171 may include the highly doped portion (p+) 1175 and very highly doped portion (p++) 1176. The very highly doped portion (p++) 1176 of the doping region 1171 may be arranged at the surface 1172 of the semiconductor substrate 1173. The very highly doped portion (p++ portion) 1176 of the doping region 1171 may be arranged between the front surface 1172 of the semiconductor substrate 1173 and the highly doped portion 1175 of the doping region 1171. The doping region 1171 may be an anode doping region (or e.g. a first anode or cathode doping region) of the diode structure 1174.

The diode structure 1174 may further include a cathode doping region 1178 (or e.g. a second anode or cathode doping region of the diode structure) arranged in the semiconductor substrate. The anode doping region 1171 may be arranged adjacent to the cathode doping region 1178, so that a p-n junction exists between the anode doping region 1171 and the cathode doping region 1178. The cathode doping region may include a lightly doped portion 1177 (e.g. a drift portion) which may be arranged directly adjacent to the highly doped portion 1175 of the anode doping region 1171. The lightly doped region 1177 may have the second conductivity type (e.g. n− doping region). The cathode doping region may further include a highly doped field stop portion (n+) 1179 and a very highly doped portion (n++) 1181 having the second conductivity type.

An average doping concentration of the field stop portion may be higher than an average doping concentration of the lightly doped portion 1177, but lower than an average doping concentration of the very highly doped portion 1181. An average doping concentration of the lightly doped region 1171 may be between $1*10^{11}$ dopants per cm$^3$ and $5*10^{14}$ dopants per cm$^3$. An average doping concentration of the field stop region 1179 after the annealing may be between $5*10^{14}$ dopants per cm$^3$ and $1*10^{17}$ dopants per cm$^3$. An average doping concentration of the very highly doped portion 1181 of the cathode doping region 1178 after annealing at least part of the semiconductor substrate is between $1*10^{17}$ dopants per cm$^3$ and $1*10^{20}$ dopants per cm$^3$.

An average doping concentration of the highly doped portion of the doping region 1171 may be at least $1*10^{14}$ dopants per cm$^3$ (or e.g. between $1*10^{14}$ dopants per cm$^3$ and $1*10^{17}$ dopants per cm$^3$).

The recombination center atoms may include at least one type of atoms from the following group of atoms, the group of atoms consisting of: platinum atoms, gold atoms and palladium atoms.

An average doping concentration of the recombination center atoms throughout the semiconductor substrate 1173 may be at least $1*10^{16}$ recombination center atoms per cm$^3$ at least $1*10^{16}$ recombination center atoms per cm$^3$ (or e.g. at least $1*10^{17}$ recombination center atoms per cm$^3$, or e.g. between $1*10^{16}$ recombination center atoms per cm$^3$ and $1*10^{19}$ recombination center atoms per cm$^3$, or e.g. between $5*10^{16}$ recombination center atoms per cm$^3$ and $5*10^{17}$ recombination center atoms per cm$^3$, or e.g. about $1*10^{16}$ recombination center atoms per cm$^3$). The average doping concentration may be a measured number of recombination center atoms per volume averaged over the thickness (between the front surface 1172 and the opposite back surface) of the semiconductor substrate 1173, for example.

An average doping concentration of recombination center atoms in the very highly doped portion of the doping region 1171 may be at least $1*10^{17}$ recombination center atoms per cm$^3$ (or e.g. at least $1*10^{18}$ recombination center atoms per cm$^3$, or e.g. between $1*10^{17}$ recombination center atoms per cm$^3$ and $1*10^{19}$ recombination center atoms per cm$^3$, or e.g. between $5*10^{17}$ recombination center atoms per cm$^3$ and $5*10^{18}$ recombination center atoms per cm$^3$, or e.g. about $1*10^{18}$ recombination center atoms per cm$^3$). The average doping concentration may be a measured number of recombination center atoms per volume averaged over the thickness of the very highly doped portion of the doping region 1171, for example.

Crystal lattice defects 1182 caused by a damage implantation by noble gas atoms may exist in the very highly doped portion 1176 of the doping region 1171.

The semiconductor device 1110 may further include an edge termination structure 1183 arranged at (or on) the front surface 1172 of the semiconductor substrate 1173. The edge termination structure 1183 may be arranged in an edge termination area of the semiconductor device 100. For example, the edge termination area may laterally surround (or may be formed laterally around) in a top view, the active device area at which the diode structure is arranged. The edge termination structure 1183 may include, or may be an oxide layer.

The semiconductor device 1110 may further include a front side contact metallization layer 1184 arranged at the front side (e.g. on the front surface 1172) of the semiconductor substrate. The front side contact metallization layer 1184 may be arranged directly adjacent to the very highly doped portion 1182 of the anode doping region 1171 having the first conductivity type, for example. The semiconductor device 1110 may further include a back side contact metallization layer 1185 (electrode) arranged at the back side (e.g. on the back surface 1186) of the semiconductor substrate 1173. The back side contact metallization layer 1185 may be arranged directly adjacent to the very highly doped portion 1181 of the cathode doping region 1178 having the second conductivity type, for example.

More details and aspects are mentioned in connection with the embodiments described above or below. The embodiments shown in FIG. 9B may comprise one or more optional additional features corresponding to one or more aspects mentioned in connection with the proposed concept or one or more embodiments described above (e.g. FIGS. 1A to 9A) or below (FIG. 9C).

FIG. 9C shows a schematic illustration of a circuit representation of a semiconductor device 1120.

The semiconductor device 1120 may include the diode structure 1174. The diode structure 1174 may be configured as a free-wheeling diode. The semiconductor device 1120 may further include a power transistor structure (e.g. an IGBT) 1187 connected to an inductive load 1188. The semiconductor device 1120 may include a gate terminal 1191 connected to a gate region 1189 of the IGBT structure 1187. The semiconductor device 1120 may further include a collector terminal 1192 connected to a collector region 1194 of the IGBT structure 1187. The semiconductor device 1120 may further include an emitter terminal 1193 connected to an emitter region 1195 of the IGBT structure 1187.

The emitter region 1195 of the IGBT structure 1187 may be connected to the inductive load 1188. For example, the inductive load 1188 may be arranged between the emitter region 1195 of the IGBT structure 1187 and the emitter terminal 1193 of the semiconductor device 1120.

A gate region 1189 of the IGBT structure 1187 may be connected to gate control circuitry, for example. For example, the gate control circuitry may be arranged between the gate 1189 of the IGBT structure 1187 and the gate terminal 1191o the semiconductor device 1120. The gate control circuitry may optionally include at least one voltage source, a resistor and an inductor, for example.

The diode structure 1174 may be connected to (e.g. configured with respect to) the power transistor structure 1187 such that the diode structure 1174 is configured to conduct a current from the power transistor 1187 if the power transistor 1187 is switched from a conducting state to a non-conducting state. For example, the diode structure 1174 may be connected to a collector region 1194 of the IGBT structure 1187. The diode structure 1174 (and/or an inductor) may be connected in parallel between the collector terminal 1192 of the semiconductor device 1120 and the collector region 1194 of the IGBT structure 1187, for example. Optionally, the diode structure 1174 (and/or the inductor) may be connected in parallel to a current source arranged between the collector terminal 1192 of the semiconductor device 1120 and the collector region 1194 of the IGBT structure 1187.

More details and aspects are mentioned in connection with the embodiments described above or below. The embodiments shown in FIG. 9C may comprise one or more optional additional features corresponding to one or more aspects mentioned in connection with the proposed concept or one or more embodiments described above (e.g. FIGS. 1A to 9B)

The various examples relate to an optimization of dynamic properties of IGBT free-wheeling diodes, for example. The various examples relate to Pt implantation technology, and to the decoupling of two competing processes for the Pt in-diffusion and the Pt gettering in Ar damage implantation. The various examples described herein provide concepts for forming a semiconductor device. The Ar damage implantation, which may be used to set the emitter efficiency, may be performed after the Pt process, and the formation of Pt silicide may be omitted. This may allow for the doses, and the energy as well in case of the argon, to be significantly reduced during the implantation. The scattering in the forward voltage and the level of leakage current may be reduced considerably and a comparable level may be achieved, as with a process using Pt diffusion from PtSi.

The aspects and features (e.g. the semiconductor substrate, the doping region, the recombination center atoms, the noble gas atoms, the diode structure, the semiconductor device) mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming a semiconductor device, the method comprising:
incorporating recombination center atoms into a semiconductor substrate;
after incorporating the recombination center atoms into the semiconductor substrate, implanting noble gas atoms into a doping region of a diode structure and/or a transistor structure, the doping region being arranged at a surface of the semiconductor substrate; and
before incorporating the recombination center atoms into the semiconductor substrate, incorporating dopants of a first type into the semiconductor substrate to form a very highly doped portion of the doping region at the surface of the semiconductor substrate, wherein a maximal doping concentration of the very highly doped portion of the doping region is at least $1*10^{18}$ dopants per $cm^3$.

2. The method of claim 1, wherein incorporating the recombination center atoms comprises:
implanting the recombination center atoms into the semiconductor substrate; and
annealing the semiconductor substrate to diffuse the recombination center atoms in the semiconductor substrate, before the noble gas atoms are implanted into the doping region.

3. The method of claim 1, wherein the recombination center atoms comprise one or more types of atoms selected from the group of atoms consisting of: platinum atoms; gold atoms; and palladium atoms.

4. The method of claim 1, wherein incorporating the recombination center atoms comprises implanting the recombination center atoms at a dose of less than 1e14 atoms per $cm^2$.

5. The method of claim 1, wherein the noble gas atoms comprise one or more types of atoms selected from the following group of atoms consisting of: argon atoms; helium atoms; neon atoms; xenon atoms; and krypton atoms.

6. The method of claim 1, wherein the noble gas atoms are implanted at a dose of less than 2e14 atoms per $cm^2$.

7. The method of claim 1, wherein the noble gas atoms are implanted at an implantation energy of less than 500 keV.

8. The method of claim 1, wherein the noble gas atoms are implanted so that a maximum concentration of crystal defects created by the implanting of the noble gas atoms is arranged within the very highly doped portion of the doping region.

9. The method of claim 1, wherein the noble gas atoms are implanted at a front surface of the semiconductor substrate, and wherein incorporating the recombination center atoms into the semiconductor substrate comprises implanting the recombination center atoms from a back surface of the semiconductor substrate.

10. The method of claim 1, further comprising:
after implanting the noble gas atoms into the doping region, thinning the semiconductor substrate from a back surface of the semiconductor substrate.

11. The method of claim 1, further comprising:
incorporating dopants of a second type into the semiconductor substrate to form a field stop region of the diode structure and/or the transistor structure.

12. A semiconductor device, comprising:
a doping region of a diode structure and/or a transistor structure, the doping region being arranged at a surface of a semiconductor substrate,
wherein a maximal doping concentration of the doping region is at least $1*10^{18}$ dopants per $cm^3$,
wherein a maximal doping concentration of recombination center atoms in the semiconductor substrate is at least $1*10^{16}$ recombination center atoms per $cm^3$,
wherein the maximal doping concentration of the recombination center atoms is located within a very highly doped region of the doping region.

13. The semiconductor device of claim 12, wherein the very highly doped portion of the doping region is arranged at the surface of the semiconductor substrate.

14. The semiconductor device of claim 13, wherein a maximal doping concentration of the very highly doped region is at least a factor of 10 higher than a maximal doping concentration of the doping region outside the very highly doped region.

15. The semiconductor device of claim 13, wherein an average doping concentration of the recombination center atoms in the very highly doped portion of the doping region is least $1*10^{17}$ recombination center atoms per $cm^3$.

16. The semiconductor device of claim 12, wherein an average doping concentration of the recombination center atoms is less than $1*10^{15}$ recombination center atoms per $cm^3$.

17. The semiconductor device of claim 12, wherein the doping region comprises an anode or cathode doping region of a diode structure, or a collector or emitter doping region of a transistor structure.

18. The semiconductor device of claim 12, further comprising:
a power transistor structure connected to an inductive load,
wherein the doping region comprises an anode or cathode doping region of a diode structure,
wherein the diode structure is configured to conduct a current from the power transistor structure if the power transistor structure is switched from a conducting state to a non-conducting state.

19. The semiconductor device of claim 12, wherein the recombination center atoms comprise one or more types of atoms selected from the group of atoms consisting of: platinum atoms; gold atoms; and palladium atoms.

20. The semiconductor device of claim 12, wherein a blocking voltage of the semiconductor device is at least 10 V.

21. A semiconductor device, comprising:
a doping region of a diode structure, the doping region being arranged at a surface of a semiconductor substrate; and
a power transistor structure connected to an inductive load,
wherein a maximal doping concentration of the doping region is at least $1*10^{18}$ dopants per $cm^3$,
wherein a maximal doping concentration of recombination center atoms in the semiconductor substrate is at least $1*10^{16}$ recombination center atoms per $cm^3$,
wherein the doping region comprises an anode or cathode doping region of the diode structure,
wherein the diode structure is configured to conduct a current from the power transistor structure if the power transistor structure is switched from a conducting state to a non-conducting state.

* * * * *